United States Patent [19]

Abe et al.

[11] 4,194,083
[45] Mar. 18, 1980

[54] CAPACITIVELY COUPLED TABLET

[75] Inventors: Kiyomi Abe; Hiromichi Takahashi, both of Soka, Japan

[73] Assignee: Pentel Kabushiki Kaisha, Japan

[21] Appl. No.: 908,790

[22] Filed: May 23, 1978

[30] Foreign Application Priority Data

May 24, 1977 [JP] Japan .................................. 52-60199

[51] Int. Cl.² ........................................... G08C 21/00
[52] U.S. Cl. ..................................................... 178/18
[58] Field of Search .......................... 178/18, 19, 20; 340/365 C, 173 CA, 146.3 SY; 235/451; 179/90 K; 200/46; 346/139 C

[56] References Cited

U.S. PATENT DOCUMENTS

| | | | |
|---|---|---|---|
| 3,567,859 | 3/1971 | Ellis et al. ............................... | 178/18 |
| 3,585,368 | 6/1971 | Nunamaker .......................... | 235/451 |
| 3,593,319 | 7/1971 | Barber ................................... | 235/451 |
| 3,757,322 | 9/1973 | Barkan et al. ...................... | 340/365 C |
| 3,951,250 | 4/1976 | Pointon et al. ................... | 340/365 C |
| 3,974,332 | 8/1976 | Abe et al. .............................. | 178/18 |

*Primary Examiner*—Thomas A. Robinson
*Attorney, Agent, or Firm*—Robert E. Burns; Emmanuel J. Lobato; Bruce L. Adams

[57] ABSTRACT

A capacitively coupled tablet for use with a probe comprises two sets of conductors spaced apart along coordinate axes to form a matrix, and an overlay disposed above the conductors and forming a plurality of key segments associated with the individual points of intersection of the matrix. A plurality of isolated electrode plates are disposed between the sets of conductors and the overlay at positions corresponding to each of the key segments, the electrode plates each being formed of a conductive material and having a size commensurate with the key segment. When a probe is applied against a particular key segment from over the overlay, the probe is capacitively coupled with selected conductors of the respective sets through the electrode plates.

11 Claims, 8 Drawing Figures

F I G. 1
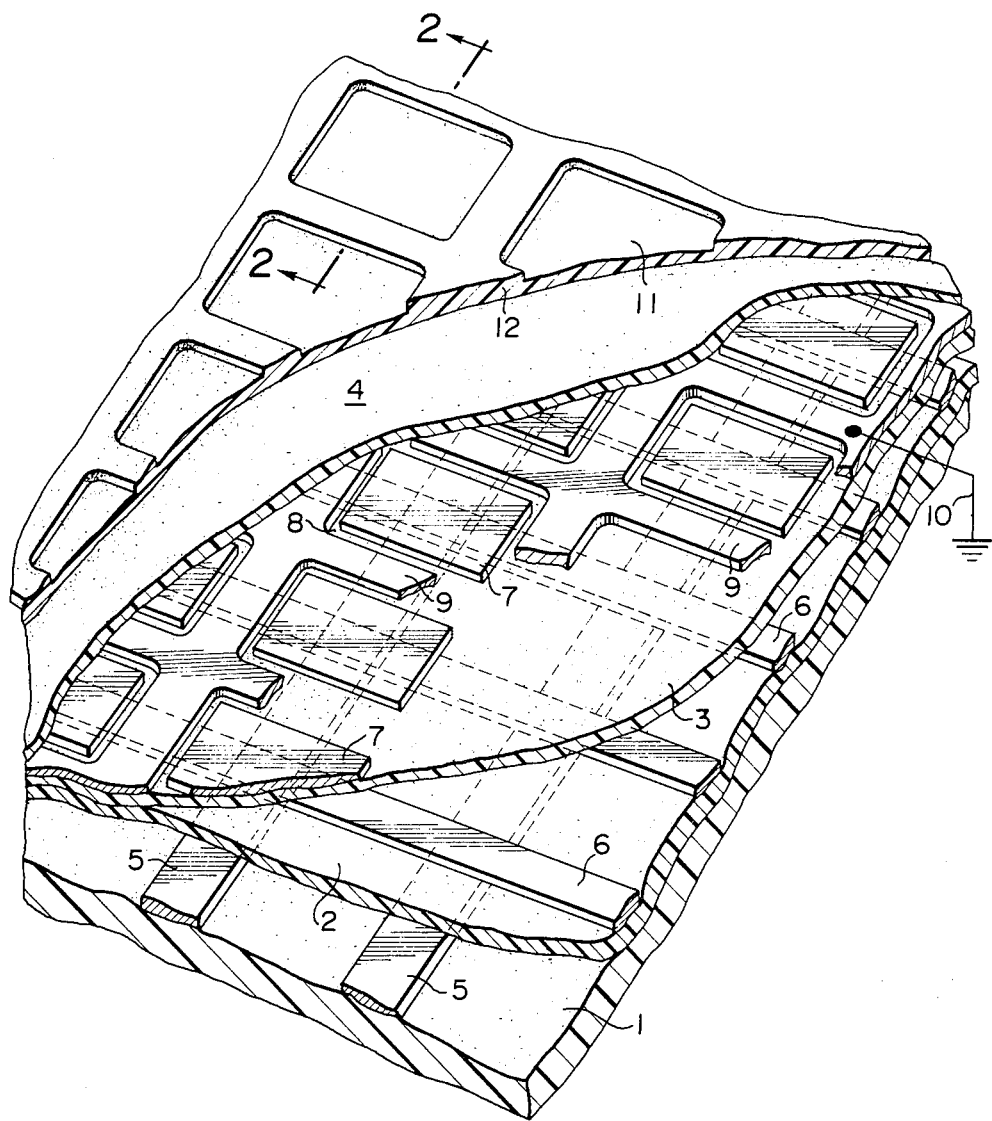

CAPACITIVELY COUPLED TABLET

FIELD OF THE INVENTION

The invention relates generally to a keyboard unit, and more particularly, to a capacititively coupled tablet having a number of key segments on its surface, each of which is capable of operating as an independent key.

U.S. Pat. No. 3,567,859 discloses a system for sequentially digitalizing the coordinate position of a probe which moves over a tablet. Increasing attention has been directed to a keyboard unit which operates on the similar principle. With this keyboard unit, when the probe is applied against one of key words in the form of a plurality of characters or the name of goods which are located at predetermined positions on the entry surface of the tablet, a digital signal is produced which corresponds to the particular key word. A tablet for such application internally includes two sets of conductors in the form of strips which are arranged along the axes of coordinate with a relatively large spacing between them so as to form a matrix, and is provided with key segments on its surface which indicate a plurality of key words. Each of the key segments is located on the point of intersection of one conductor from one set with another conductor from the other set. In this manner, each key segment has its particular address. An overlay is disposed on the surface of the tablet so as to be detachable for replacement, and an indication of the key segments is given on the overlay. A plurality of overlays may be used in superimposed relationship. One set of conductors is pulsed in a sequential manner, followed by the pulsing of the other set of conductors. When the probe is applied against a key segment corresponding to a desired key word, it is capacitively coupled with the individual conductors of both sets which extend through the segment, thus picking up pulses from the respective conductors at given timings. The two pulses sensed in this manner are used to define a particular address indicative of the coordinate position of the particular key segment against which the probe is applied.

The probe will pick up pulses of highest magnitude at the moments when the individual conductors which pass through the associated key segment are pulsed. However, it will also pick up pulses when other conductors which pass through adjacent key segments are pulsed, thus producing the problem of crosstalk. Then it will be seen that the keyboard unit must be arranged to respond to one of the pulses of a sequence which has the maximum amplitude.

DESCRIPTION OF THE PRIOR ART

In order to assure an accurate operation of the unit by minimizing the crosstalk, U.S. Pat. No. 3,974,332, assigned to the same assignee as the present application, discloses a shield layer of conductive material having apertures aligned with the individual key segments and which is superimposed on the two sets of conductors. Each set of conductors is disposed on opposite sides of a dielectric layer from the other set of conductors, and each of the conductors which are situated in the lower set has an increased area in each segment than the corresponding conductors of the upper set which is nearer the surface of the tablet, in order to compensate for the loss resulting from an increased distance from the probe and the loss caused by the shielding effect of te upper conductors, by increasing the pulse picked up from the lower conductor.

For the convenience of use, it is desirable that each key segment has a sufficient area to indicate an associated key word clearly (which may be 6×6 mm to indicate a single character or 6×24 mm to indicate the name of goods) and that a pulse of a given magnitude be picked up by the probe if the latter is applied to anywhere within the segment having such increased area. However, with this construction of the tablet, there occurs a difference in the level of pulses which can be obtained by the probe when it is applied to different locations within a single segment. Where a plurality of overlays are used in superimposition, there is a further possibility that a pulse of lower level cannot be distinguished from crosstalk, since the pulse of lower level cannot reach a prescribed threshold level. This is due to the fact that the effective area of the upper and lower conductors cannot be increased beyond 40 to 60 percent at maximum of the full area of the key segment, considering the need to compensate for the losses associated with the lower conductors.

For an effective arrangement of the sets of conductors within key segments, Japanese Patent Publication No. 52-4414 discloses disposing the lower conductors over the entire area of their associated key segments and uniformly distributing the upper conductors which have openings or slits formed therein. However, since the proportion of area which the upper or lower conductor occupies relative to the full area of the key segment remains unchanged, there is still the problem of a differential pulse level which depends on the location within the segment where the probe is applied. In addition, with this tablet arrangement, the spacing between the lower conductors will be less than that between the upper conductors, so that the crosstalk between the conductors of the lower set will be increased. While this difficulty can be avoided by increasing the spacing between the lower conductors, this results in an increased dead space between the key segments.

In Japanese Laid-Open Patent Application No. 51-104,221, the assignee of the present application has proposed an arrangement in which each set of conductors is formed by wires having an insulating coating and which are woven so that there is a plurality of conductors pulsed with the common timing within each segment. With this tablet, a plurality of conductors of each set located within a key segment are alternately disposed in upper and lower layers so that the conductors of each set can occupy nearly 50 percent of the total area of the segment. When a plain weave pattern of a close spacing is employed, the problem of level differences between pulses which are picked up from various positions within the segment can be minimized. However, the required construction is complex and is difficult to manufacture.

SUMMARY OF THE INVENTION

It is an object of the invention to provide a capacitively coupled tablet having a plurality of key segments and which is constructed to permit a pulse of uniform level to be picked up by the probe if the latter is applied to any point within the key segment.

It is another object of the invention to provide a capacitively coupled tablet which minimizes the crosstalk between adjacent key segments to a negligibly small level.

It is a specific object of the invention to provide a capacitively coupled tablet of the kind described which is simple in construction and hence can be manufactured inexpensively.

Briefly, the invention provides a capactively coupled tablet including two sets of conductors spaced apart along coordinate axes to form a conductor matrix, and an overlay disposed over the conductors and forming a plurality of key segments each associated with one point of intersection of the matrix. In accordance with the invention, a plurality of electrode plates formed of a conductive material is disposed between the sets of conductors and the overlay in association with each key segment. Each electrode plate is capacitively coupled with conductors of each set which extend through the corresponding key segment so that when the probe is applied to a particular key segment from over the overlay, the probe is capacitively coupled with the respective sets of conductors through the electrode plate. The two sets of conductors may be insulated from each other by a dielectric layer interposed therebetween in known manner. However, these conductors need not be woven in the manner proposed by Japanese Laid-Open Patent Application No. 51-104,221. Each electrode plate is electrically insulated from the two sets of conductors by a dielectric layer. The sets of conductors are sequentially pulsed in a known manner, but a plurality of conductors which are energized with pulses of a common timing can be regarded as constituting a single conductor. For this reason, such plurality of conductors are treated as a single conductor in the description to follow.

In a preferred embodimemt of the invention, each electrode plate has a broad area substantially commensurate with the total area of the associated key segment, and is surrounded by a shield layer with a clearance therebetween. The shield layer can be formed of a conductive material as disclosed in U.S. Pat. No. 3,974,332 and connected to ground potential. The electrode plates and the shield layer can be simultaneously formed in a single plane by chemically etching a copper foil which is coated on the dielectric layer. Alternatively, the shield layers may be disposed on the opposite side of the dielectric layer from the electrode plates. In this instance, the electrode plates and the shield layer may have their marginal edges overlapping in different planes, thus avoiding the need to provide a clearance therebetween.

BRIEF DESCRIPTION OF THE DRAWINGS

FIG. 1 is a perspective view, partly broken away, of the capacitively coupled tablet according to the invention;

DESCRIPTION OF PREFERRED EMBODIMENT

Figure 2:
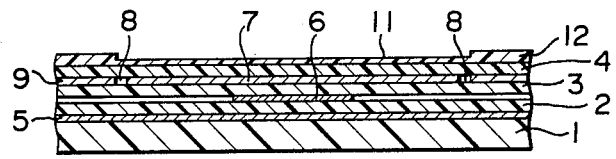
FIG. 2 is a schematic cross section taken along the line 2—2 shown in FIG. 1.

Referring to FIGS. 1 and 2, the tablet according to the invention comprises four successive dielectric layers 1, 2, 3 and 4 which are adhesively bonded together. First dielectric layer 1 is relatively thick and serves as a base, and a set of spaced conductors 5 extending along one the coordinate axes are disposed in parallel relationship between first and second dielectric layers 1, 2. Another set of spaced conductors 6 extending along the other coordinate axis are disposed in parallel relationship between the second and third dielectric layers 2, 3. As is known, these sets of conductors 5, 6 can be formed by providing a printed wiring on both surfaces of the second dielectric layer 2. It will be appreciated that in operation one set of conductors is sequentially pulsed, followed by a sequential pulsing of the other set of conductors, and that such pulsing sequence is repeated. In accordance with the invention, a plurality of electrode plates 7 and a shield layer 9 having a plurality of apertures 8 which surround the respective electrode plates with a slight clearance therebetween are disposed atop the third dielectric layer 3. Both the electrode plates 7 and the shield layer 9 are formed of a conductive material. The electrode plates 7 are isolated from each other, and the shield layer 9 is connected to ground potential through a lead wire 10. Each of the electrode plates 7 is located above one of the matrix points defined by the two sets of conductors 5, 6. As mentioned previously, the plates and shield layer 9 can be formed by chemical etching of a copper foil which coats the dielectric layer 3. In the example shown, a fourth dielectric layer 4 is disposed atop the third dielectric layer 3 so as to cover the electrode plates 7 and shield layer 9, the layer 4 defining the surface of the tablet.

In the embodiment described above, an overlay 12 formed of a dielectric material having a plurality of key segments 11 is detachably mounted on the fourth dielectric layer 4. In the instance shown, the overlay 12 comprises a sheet of synthetic resin material which is recessed to provide key segments 11. Each of the key segments 11 is aligned with a corresponding one of the electrode plates 7, and is labelled with a particular character or characters or a key word such as the name of goods. The overlay 12 may be formed of a transparent material, and a paper printed with key words may be interposed between the overlay 12 and the surface of the tablet defined by the fourth dielectric layer 4. Alternatively, the overlay 12 may be replaced by a paper which is printed with partition lines and also printed with key words each located within individual compartments. Where it is unnecessary to change the key words, such partition lines and key words may be directly provided on the fourth dielectric layer 4, which then serves as an overlay.

With the tablet described above, when a probe, not shown, is applied against a particular key segment 11 in the overlay 12, it is capacitively coupled with conductors 5, 6 of respective ones of the conductor sets through one of the electrode plates 7 which is associated with the particular key segment 11. Thus, it will be seen that if each electrode plate 7 extends across substantially the full area of the key segment 11, the capacitance established between the probe and the electrode plate 7 will be uniform if the probe is moved across the full area of the key segment. Hence, when the capacitance between the individual electrode plates 7 and the sets of conductors 5, 6 is uniform, the objective of the invention initially mentioned will be achieved. To this end, the proportion of the area occupied by the lower conductor 5 to the area of the electrode plate 7 is made somewhat greater than the proportion of the area occupied by the upper conductor 6 in order to compensate for the loss associated with the lower conductor 5 which results from the increased spacing therebetween. The individual conductors 5, 6 of each set may have an area which is substantially reduced as compared with that of a conventional tablet, and may cross each other below the center of the associated electrode plates, whereby the conductors of the sets which extend through a particular key segment 11 may be separated from the conductors extending through adjacent key segments by a greater distance. Since adjacent electrode plates 7 are separated by the shield layer 9 which is connected to ground potential, the dead space can be minimized without increasing the crosstalk between adjacent electrode plates.

Figure 3:
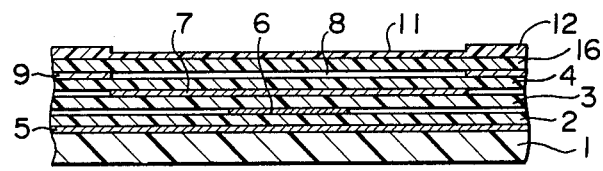
FIGS. 3, 4 and 5 are similar cross sections of slightly different capacitively coupled tablets.
Figure 4:
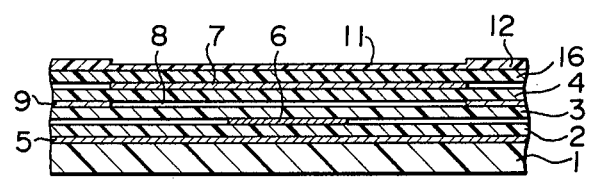
Figure 5:
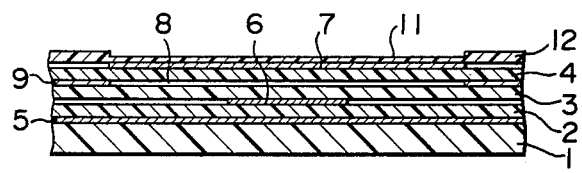

In a preferred embodiment, the key segment 11 has a dimension which is commensurate with the aperture 8 formed in the shield layer 9, and the electrode plate 7 is placed within the aperture 8 with a small clearance therebetween. In a modification shown in FIG. 3, the electrode plate 7 may be disposed between the third and fourth dielectric layer 3, 4 and the shield layer 9 may be disposed atop the fourth dielectric layer 4, with a fifth dielectric layer 16 additionally provided to cover the shield layer 9. In this instance, each electrode plate 7 is insulated from the shield layer 9 by the dielectric layer 4, and hence may have a size which is commensurate with the key segment 11 as is the apertures 8 in the shield layer 9, or may have an even greater size. With this modified arrangement, there is no substantial clearance between individual electrode plates 7 and shield layer 9, whereby the full area of each key segment 11 is covered by the associated electrode plate 7 located below. As shown in FIG. 4, the relative arrangement of the electrode plate 7 and the shield layer 9 may be changed. Since the overlay 12 is placed on top of the tablet, each electrode plate 7 may be disposed on the fourth dielectric layer 4 which defines the surface of the tablet, as shown in FIG. 5. In this instance, the electrode plates 7 may be formed by printing of a conductive paint.

In FIGS. 2 to 5, gaps are shown between adjacent dielectric layers, but it should be understood that this showing is exaggerated for purpose of illustration. In the actual tablet products, there is no such substantial gap.

Figure 6:
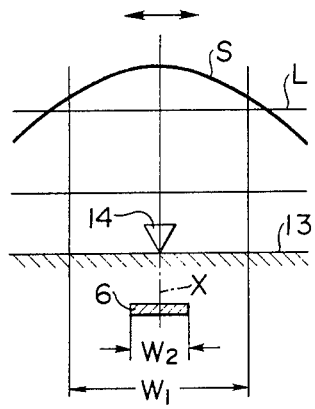
FIGS. 6 and 7 are schematic illustrations of conventional capacitively coupled tablets together with graphs indicating the operation thereof.
Figure 7:
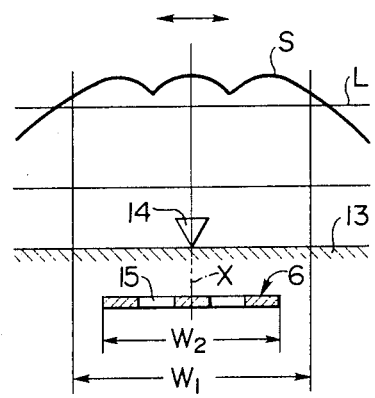
Figure 8:
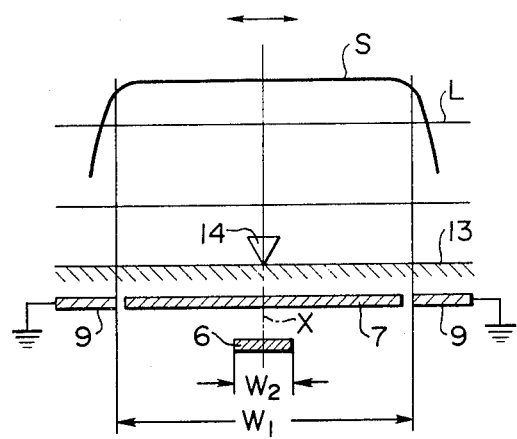
FIG. 8 is a similar illustration of the capacitively coupled tablet of the invention, also graphically illustrating the operation thereof.

FIGS. 6, 7 and 8 graphically illustrate the operation of the tablet according to the invention as compared with a conventional tablet. The curve in each Figure graphically shows a signal which is sensed by a probe 14 as it is moved along the surface 13 of the tablet in a direction indicated by the double-headed arrow, namely, in a direction to cross the conductor 6. This conductor is assumed to be the upper conductor of the tablet to which a constant voltage is applied. The abscissa represents the distance of the probe 14 from a centerline X passing through the conductor 6 in a direction perpendicular to the surface 13 of the tablet. The ordinate represents the signal level, and a horizontal line L running parallel to the abscissa represents the threshold level of the device. FIG. 6 shows the signal level obtained from a conventional tablet having a strip-shaped conductor 6. As shown, the signal level decreases as the probe 14 is moved away from the centerline X. Taking into account a small though necessary margin of signal level over the threshold level L, it will be seen that the width $W_1$ of the key segment 11 is limited to a relatively small value. When the width $W_2$ of the conductor 6 is increased relatively to the width $W_1$ of the key segment 11, there will be an adverse influence upon the other conductor which is located below the conductor 6. FIG. 7 shows the signal level obtained from an improved tablet having a wider conductor 6 in which two slits 15 are formed. While the width $W_1$ of the key segment can be increased more than the width dimension shown in FIG. 6, the signal level has depressions directly above the slits 15, reducing the signal level margin over the threshold level L. Hence, if a plurality of overlays are used in superimposition on the surface 13 of the tablet, general reduction of the signal level may result in the failure of an output signal to be produced in the region of these depressions. By contrast, FIG. 8 shows a tablet according to the invention in which the probe 14 remains capacitively coupled with the conductor 6 through the electrode plate 7 interposed therebetween, at any position within the key segment 11. As a consequence, the signal level sensed by the probe is uniform throughout the key segmemt 11. The disposition of the shield layer 9 in surrounding relationship with the electrode plate 7 causes a rapid decrease in the signal level when the probe is moved out of the region corresponding to the area of the electrode plate 7, thus minimizing crosstalk between adjacent electrode plates 7. The coupling between the probe and the lower conductor may be similarly understood even though there is a certain loss associated with the shielding effect of the upper conductor. From the foregoing description, it will be understood that if the electrode plate 7 is appropriately sized and arranged relative to the key segment 11, a pulse of uniform level can be picked up by the probe if it is located anywhere within the key segment, thus assuring a stable operation of the tablet if the key segment 11 has an increased area.

What is claimed is:

1. A capacitively coupled tablet for use with a probe comprising: two sets of mutually insulated conductors spaced apart along coordinate axes to define a conductor matrix; one set of conductors being sequentially pulsed before the other set of conductors are pulsed in a repeated manner during use of the tablet; an overlay disposed above the sets of conductors and having a plurality of key segments defined in its surface, each key segment being located above a point of intersection of the conductors of each set; and a plurality of electrode plates disposed between the conductors and the overlay and being isolated from each other and corresponding to each of the key segments; whereby the probe can be applied against a particular key segment from over the overlay to achieve capacitive coupling with associated conductors of the respective sets through the electrode plate thereby sensing pulses of given timings from the conductors.

2. A capacitively coupled tablet according to claim 1 in which each electrode plate has an area which is defined within the area of the corresponding key segment.

3. A capacitively coupled tablet according to claim 1, further including a shield layer of a conductive material disposed between the overlay and the sets of conductors, the shield layer being connected to ground potential and electrically insulated from each electrode plate, the shield layer having a plurality of apertures formed therein which correspond to the key segments thereby allowing the probe to be capacitively coupled with the sets of conductors through the electrode plate.

4. A capacitively coupled tablet according to claim 3 in which each electrode plate lies in a common plane with the shield layer and is disposed in the aperture thereof with a clearance therebetween.

5. A capacitively coupled tablet according to claim 3 in which the electrode plates are disposed in a plane distinct from the shield layer and separated therefrom by a dielectric material.

6. A capacitively coupled tablet comprising: first, second, third and fourth dielectric layers which are successively disposed one above the other; two sets of conductors spaced apart along coordinate axes to define a conductor matrix, one set of conductors being disposed between the first and second layers and the other set of conductors being disposed between the second and third layers; a plurality of electrodes disposed between the third and fourth layers and being isolated from each other, each electrode being located above the point of intersection between conductors of the two sets; and a shield layer of a conductive material disposed between the third and fourth dielectric layers and surrounding each electrode with a clearance therebetween.

7. A capacitively coupled tablet comprising: first, second, third and fourth dielectric layers which are successively disposed one above the other; two sets of conductors spaced apart along coordinate axes to define a conductor matrix, one set of conductors being disposed between the first and second layers and the other set of conductors being disposed between the second and third layers; a shield layer of a conductive material disposed between the third and fourth dielectric layers and having a plurality of apertures formed therein which are located above the points of intersection between the conductors of the two sets; and a plurality of electrodes disposed on the surface of the fourth dielectric layer and being isolated from each other, each electrode occupying a position corresponding to each aperture formed in the shield layer.

8. A capacitively coupled tablet comprising: first, second, third, fourth and fifth dielectric layers successively disposed one above another; two sets of conductors spaced apart along coordinate axes to define a conductor matrix, one set of conductors being disposed between the first and second layers and the other set of conductors being disposed between the second and third layers; a plurality of electrodes disposed between the third and fourth layers and being isolated from each other, each electrode being located above the point of intersection between the conductors of the two sets; and a shield layer of a conductive material disposed between the fourth and fifth dielectric layers and having apertures formed therein which are aligned with the respective electrodes.

9. A capacitively coupled tablet comprising: first, second, third, fourth and fifth dielectric layers successively disposed one above another; two sets of conductors spaced apart along coordinate axes to define a conductor matrix, one set of conductors being disposed between the first and second layers and the other set of conductors being disposed between the second and third layers; a shield layer of a conductive material disposed between the third and fourth dielectric layers and having a plurality of apertures formed therein which are located above the points of intersection between the conductors of the two sets; and a plurality of electrodes disposed between the fourth and fifth dielectric layers and being isolated from each other, each electrode being located in alignment with a corresponding aperture in the shield layer.

10. A capacitively coupled tablet according to claim 7, 8 or 9 in which each electrode has the same area as the associated aperture.

11. A keyboard unit comprising
(a) a tablet including two sets of conductors spaced apart along coordinate axes to define a conductor matrix and being electrically insulated from each other, each set of conductors being sequentially pulsed during use of the keyboard unit,
(b) an overlay disposed above the sets of conductors and having a plurality of key segments defined in its surface, each key segment being located to cover a point of intersection between the conductors of the respective sets,
(c) a probe operable to be applied against a particular key segment from over the overlay to pick up particular pulses from the associated conductors of the respective sets, and
(d) a plurality of electrode plates isolated from each other and disposed over the points of intersection between the conductors of the respective sets, the plates being electrically insulated from the conductors,
(e) whereby the probe can be capacitively coupled with the sets of conductors associated with the particular key segment through the corresponding electrode plate.

* * * * *